(12) United States Patent
Chen et al.

(10) Patent No.: US 10,011,532 B2
(45) Date of Patent: Jul. 3, 2018

(54) REMOTE PLASMA SYSTEM AND METHOD

(71) Applicant: Taiwan Semiconductor Manufacturing Company, Ltd., Hsin-Chu (TW)

(72) Inventors: Fei-Fan Chen, Hsin-Chu (TW); Wen-Sheng Wu, Hsin-Chu (TW); Chien Kuo Huang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 341 days.

(21) Appl. No.: 14/612,131

(22) Filed: Feb. 2, 2015

(65) Prior Publication Data
US 2015/0155185 A1    Jun. 4, 2015

Related U.S. Application Data

(62) Division of application No. 13/679,453, filed on Nov. 16, 2012, now Pat. No. 8,944,003.

(51) Int. Cl.
| | |
|---|---|
| *C04B 35/10* | (2006.01) |
| *H05H 1/46* | (2006.01) |
| *H01J 37/32* | (2006.01) |
| *H01L 21/02* | (2006.01) |

(Continued)

(52) U.S. Cl.
CPC .......... *C04B 35/10* (2013.01); *C23C 16/403* (2013.01); *C23C 16/452* (2013.01); *H01J 37/3244* (2013.01); *H01J 37/32357* (2013.01); *H01J 37/32477* (2013.01); *H01L 21/0217* (2013.01); *H01L 21/02219* (2013.01); *H01L 21/02263* (2013.01); *H01L 21/02274* (2013.01); *H05H 1/46* (2013.01); *H05H 2001/4667* (2013.01); *Y10T 29/49117* (2015.01)

(58) Field of Classification Search
CPC .............. C04B 35/10; H01L 21/02263; H01L 21/02274; H01L 21/02219; H01L 21/0217; C23C 16/452; C23C 16/403; H01J 37/32477; H01J 37/3244; H01J 37/32357; H05H 1/46; H05H 2001/4667; Y10T 29/49117
USPC ...... 118/715; 156/345.1; 216/68, 69, 70, 67; 438/709, 710
See application file for complete search history.

(56) References Cited

U.S. PATENT DOCUMENTS

| | | | | |
|---|---|---|---|---|
| 5,111,111 A | * | 5/1992 | Stevens ............. | H01J 37/32192 118/723 MR |
| 5,255,286 A | * | 10/1993 | Moslehi ................ | G01J 5/0003 250/227.11 |

(Continued)

OTHER PUBLICATIONS

Applied Materials, Inc., "APC Introduction," Mar. 2011, 14 pages.

(Continued)

*Primary Examiner* — Rudy Zervigon
(74) *Attorney, Agent, or Firm* — Slater Matsil, LLP

(57) ABSTRACT

A system and method for generating and using plasma is provided. An embodiment comprises a plasma generating unit that comprises beta-phase aluminum oxide. A precursor material is introduced to the plasma generating unit and a plasma is induced from the precursor material. The plasma may be used to deposit or etch materials on a semiconductor substrate.

20 Claims, 2 Drawing Sheets

(51) Int. Cl.
*C23C 16/40* (2006.01)
*C23C 16/452* (2006.01)

(56) References Cited

U.S. PATENT DOCUMENTS

| | | | | |
|---|---|---|---|---|
| 5,290,382 | A * | 3/1994 | Zarowin | H01J 37/32357 118/723 ER |
| 5,741,070 | A * | 4/1998 | Moslehi | B24B 37/013 257/E21.528 |
| 6,150,628 | A * | 11/2000 | Smith | H01J 27/16 156/345.28 |
| 6,418,874 | B1 * | 7/2002 | Cox | H01J 37/32009 118/723 I |
| 6,432,260 | B1 * | 8/2002 | Mahoney | H01J 37/321 118/723 AN |
| 6,712,020 | B2 * | 3/2004 | Cox | H01J 37/32009 118/723 I |
| 6,820,570 | B2 * | 11/2004 | Kilpela | C23C 16/4412 118/723 E |
| 6,902,814 | B2 * | 6/2005 | Takahashi | C03C 17/007 427/453 |
| 7,363,876 | B2 * | 4/2008 | Lai | H01J 37/32431 118/723 R |
| 7,411,148 | B2 * | 8/2008 | Kwon | H01J 37/321 118/723 IR |
| 7,501,600 | B2 * | 3/2009 | Holber | H01J 37/32009 118/723 I |
| 7,541,558 | B2 * | 6/2009 | Smith | H05H 1/46 118/723 I |
| 7,700,465 | B2 * | 4/2010 | Collins | H01J 37/32082 257/E21.001 |
| 7,981,808 | B2 | 7/2011 | Luo et al. | |
| 8,035,056 | B2 * | 10/2011 | Kwon | H01J 37/321 118/723 I |
| 8,124,048 | B2 * | 2/2012 | Mizuno | C01F 7/02 423/625 |
| 8,357,262 | B2 * | 1/2013 | Nakahara | C04B 35/117 118/723 R |
| 8,394,231 | B2 * | 3/2013 | Takatsuki | H01J 37/32009 118/723 E |
| 8,409,400 | B2 * | 4/2013 | Wi | H01J 37/32357 118/723 I |
| 8,430,962 | B2 * | 4/2013 | Masuda | C23C 16/45561 118/663 |
| 8,652,297 | B2 * | 2/2014 | Collins | H01J 37/32091 118/723 E |
| 8,679,255 | B2 * | 3/2014 | Masuda | C23C 16/45561 118/663 |
| 8,771,538 | B2 * | 7/2014 | Lubomirsky | H01J 37/32357 156/345.24 |
| 8,779,322 | B2 * | 7/2014 | Holber | H01J 37/32174 219/121.41 |
| 8,944,003 | B2 * | 2/2015 | Chen | H01L 21/02263 118/723 E |
| 9,216,928 | B2 * | 12/2015 | Citti | C03B 17/064 |
| 9,502,242 | B2 * | 11/2016 | Won | H01L 21/02565 |
| 2002/0113344 | A1 * | 8/2002 | Kitagawa | C04B 35/113 264/618 |
| 2002/0157793 | A1 * | 10/2002 | Cox | C23F 1/08 156/345.1 |
| 2003/0085205 | A1 * | 5/2003 | Lai | H01J 37/32431 219/121.43 |
| 2003/0097987 | A1 * | 5/2003 | Fukuda | C23C 16/4405 118/723 E |
| 2003/0198749 | A1 * | 10/2003 | Kumar | C04B 41/009 427/376.3 |
| 2004/0182517 | A1 * | 9/2004 | Lai | H01J 37/32431 156/345.48 |
| 2004/0200417 | A1 * | 10/2004 | Hanawa | C23C 14/48 118/723 I |
| 2004/0226512 | A1 * | 11/2004 | Lai | H01J 37/32431 118/723 I |
| 2005/0051089 | A1 * | 3/2005 | Tauchi | C23C 16/4404 118/715 |
| 2005/0145173 | A1 * | 7/2005 | Holber | H01J 37/32009 118/723 E |
| 2006/0162661 | A1 * | 7/2006 | Jung | C23C 16/345 118/723 ER |
| 2006/0277897 | A1 * | 12/2006 | Slone | F01N 3/206 60/286 |
| 2007/0131171 | A1 * | 6/2007 | Takatsuki | H01J 37/32009 118/723 R |
| 2008/0179009 | A1 * | 7/2008 | Collins | H01J 37/32357 156/345.35 |
| 2008/0283499 | A1 * | 11/2008 | Nakahara | C04B 35/117 216/67 |
| 2009/0017227 | A1 * | 1/2009 | Fu | C23C 16/0245 427/569 |
| 2009/0277874 | A1 * | 11/2009 | Rui | H01J 37/32357 216/67 |
| 2010/0021374 | A1 * | 1/2010 | Mizuno | C01F 7/02 423/625 |
| 2011/0011338 | A1 | 1/2011 | Chuc et al. | |
| 2011/0114601 | A1 * | 5/2011 | Lubomirsky | H01J 37/3211 216/68 |
| 2011/0115378 | A1 * | 5/2011 | Lubomirsky | H01J 37/32357 315/111.21 |
| 2014/0130980 | A1 * | 5/2014 | Lee | H01J 37/32192 156/345.29 |
| 2015/0155185 | A1 * | 6/2015 | Chen | H01L 21/02263 438/694 |
| 2015/0259802 | A1 * | 9/2015 | Ruzic | C23C 16/517 427/446 |

OTHER PUBLICATIONS

Arribart, Herve et al. "Beta-alumina," Materials of Science & Engineering, Feb. 16, 2001, 2 pages, http://authors.library.caltech.edu/5456/1/hrst.mit.edu/hrs/materials/public/Beta-alumina.htm, last accessed Nov. 11, 2012.

Chen, Roy, "Flowable-CVD Alectrona Introduction," Applied Materials, Inc., Nov. 20, 2009; 28 pages.

"Overview of Alumina," http://www.rci.rutgers.edu/~glock/old/mse/topics/alumina.html, dated at least as early Nov. 14, 2012; 3 pages.

* cited by examiner

REMOTE PLASMA SYSTEM AND METHOD

PRIORITY

This application is a divisional of U.S. patent application Ser. No. 13/679,453 filed Nov. 16, 2012, and entitled "Remote Plasma System and Method," which application is incorporated herein by reference.

BACKGROUND

Generally, to form a semiconductor device such as an integrated circuit, a silicon wafer is initially prepared and a series of processes such as etching, depositing, coating, plating, patterning, and the like are performed in order to manufacture structures on the semiconductor wafer as well as forming interconnections between the structures once the structures are formed. These processes may be utilized to form both conductive paths (e.g., form metals and other conductive materials) and non-conductive regions (e.g., form dielectric materials) in order to separate and isolate the conductive paths from each other so that short circuits and other problems do not form during manufacture or operation of the semiconductor device. All of these processes, along with other processes, may be used to finalize the semiconductor device for use by a consumer.

As some of these processes have grown in popularity for the manufacturing of semiconductor devices, extensive research has been performed to find ways to enhance these processes for the ultimate goal of scaling down the semiconductor devices even further. One such enhancement that has been utilized is the use of plasma in deposition and etching processes. The plasma is especially useful in the enhancement of chemical and physical reactions that occur during the deposition and etching processes. For example, the plasma may be used to help initiate chemical reactions, or may be used to control the speed of the desired chemical or physical reactions. By enhancing the reactions, the processes may be made to be more efficient, and by making the overall processes more efficient, the overall process for making the semiconductor device may also be made to be more efficient.

However, the use of plasma in processes such as deposition and etching, while helping in some respects, also creates problems and challenges with its use. These problems need to be addressed to make the use of plasma within these processes even more efficient.

BRIEF DESCRIPTION OF THE DRAWINGS

For a more complete understanding of the present embodiments, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely a chemical vapor deposition processing chamber for a 20 µm, 14 µm, or smaller processing node. Other embodiments may also be applied, however, to other plasma assisted processes and devices.

Figure 1:
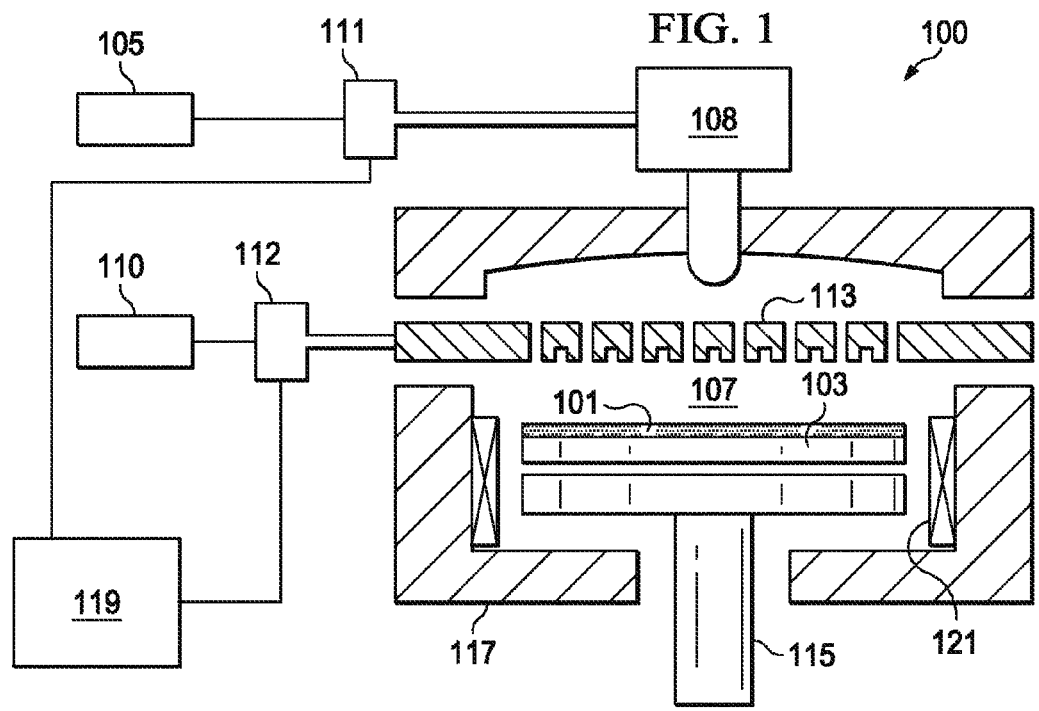
FIG. 1 illustrates a deposition chamber with a plasma generator in accordance with an embodiment.

With reference now to FIG. 1, there is shown a deposition system 100 using remote plasma that may be utilized to form a deposited layer 101 on a substrate 103 in a process such as flowable chemical vapor deposition. However, while the embodiment is described with reference to the deposition system 100, the embodiments are not limited to a deposition process. Rather, any process that utilizes a plasma may benefit from the embodiments, such as plasma assisted etching processes, plasma treatment processes, or the like. All such plasma processes and remote plasma processes are fully intended to be included within the scope of the embodiments.

In an embodiment the deposition system 100 may utilize two or more precursor materials to form the deposited layer 101. For example, the deposition system 100 may receive precursor materials from a first precursor delivery system 105 and a second precursor delivery system 110, to form the deposited layer 101 onto the substrate 103. The formation of the deposited layer 101 may be performed in a deposition chamber 107 which receives the first precursor material and the second precursor material.

The first precursor delivery system 105 and the second precursor delivery system 110 may work in conjunction with one another to supply the various different precursor materials to the deposition chamber 107. In an embodiment in which the first precursor material is in a gaseous state during preparation and storage (e.g., a first precursor material such as ammonia), the first precursor delivery system 105 may comprise a first precursor material supplier, such as a gas storage tank or a machine to generate the first precursor material on an as-needed basis in order to supply it to a plasma block 108 (discussed further below).

Alternatively, in an embodiment where the first precursor material is either a liquid or solid precursor material, the first precursor delivery system 105 may comprise a carrier gas supply (not individually illustrated) and a precursor canister (not individually illustrated) arranged in series. The carrier gas supply may be, e.g., an inert gas and may be used to help "carry" the precursor gas to the plasma block 108 and into the deposition chamber 107 and may be coupled to the precursor canister, which may be utilized to supply a desired precursor (e.g., the first precursor material) to the deposition chamber 107 by vaporizing or sublimating precursor materials that may be delivered in either a solid or liquid phase. The precursor canister may have a vapor region into which precursor material is driven into a gaseous phase so that the carrier gas from the flow controller may enter the precursor canister and pick-up or carry the gaseous precursor material out of the precursor canister and towards the deposition chamber 107.

The first precursor delivery system 105 is connected to and supplies the first precursor material to a first precursor gas controller 111, which may supply the first precursor material to the plasma block 108 before the first precursor material enters the deposition chamber 107. In an embodiment the first precursor gas controller may include such devices as valves, flow meters, sensors, and the like to control the connection and delivery rate of the first precursor material to the plasma block 108. The first precursor gas controller 111 may be controlled and receive instructions from a control unit 119.

The second precursor delivery system 110 may comprise components similar to the first precursor delivery system 105. For example, if the second precursor material is in a gaseous state during preparation and storage, the second precursor delivery system 110 may comprise a second precursor material supplier, such as a gas storage tank or a machine to generate the second precursor material on an as-needed basis. Alternatively, if the second precursor material is in a liquid or solid state during preparation and storage, the second precursor delivery system 110 may be implemented using a carrier gas and a sublimation/vaporization process.

The second precursor delivery system 110 may supply a stream of the second precursor material to, e.g., a second precursor gas controller 112, which may supply the second precursor material to the showerhead 113 without turning it into a plasma as the second precursor material (in a non-plasma phase) enters the deposition chamber 107. In an embodiment the second precursor gas controller 112 may be similar to the first precursor gas controller 111 (discussed above) and may include such devices as valves, flow meters, sensors, and the like to control the connection and delivery rate of the second precursor material to the showerhead 113. The second precursor gas controller 112 may also be controlled and receive instructions from the control unit 119.

The first precursor gas controller 111 and the second precursor gas controller 112, upon receiving instructions from the control unit 119, may open and/or close valves so as to connect the first precursor delivery system 105 and the second precursor delivery system 110 to the plasma block 108 and the deposition chamber 107, respectively, and direct the desired precursor materials to their respective destinations. For example, the first precursor gas controller 111 will direct the first precursor material to the plasma block 108 and the second precursor gas controller 112 will direct the second precursor material to the showerhead 113.

The showerhead 113 may be a dual-zone showerhead utilized to disperse the chosen precursor materials into the deposition chamber 107 and may be designed to evenly disperse the precursor materials in order to minimize undesired process conditions that may arise from uneven dispersal. In an embodiment the showerhead 113 may have a dual dispersion design that accepts both the first precursor material (through, e.g., a first plasma inlet) and the second precursor material (through, e.g., a second inlet) at the same time and will disperse both the first precursor material and the second precursor material in an even distribution around the deposition chamber 107. The showerhead 113 may have a circular design with openings dispersed evenly around the showerhead 113 to allow for the dispersal of the first precursor material and the second precursor material into the deposition chamber 107.

The deposition chamber 107 may receive the desired precursor materials and expose the precursor materials to the substrate 103, and the deposition chamber 107 may be any desired shape that may be suitable for dispersing the precursor materials and contacting the precursor materials with the substrate 103. In the embodiment illustrated in FIG. 1, the deposition chamber 107 has a cylindrical sidewall and a bottom. Furthermore, the deposition chamber 107 may be surrounded by a housing 117 made of material that is inert to the various process materials. In an embodiment, the housing 117 may be steel, stainless steel, nickel, aluminum, alloys of these, or combinations of these.

Within the deposition chamber 107 the substrate 103 may be placed on a mounting platform 115 made of, e.g., aluminum, in order to position and control the substrate 103 during the deposition process. The mounting platform 115 may be rotatable and may include heating mechanisms in order to heat the substrate 103 during the deposition process. Furthermore, while a single mounting platform 115 is illustrated in FIG. 1, any number of mounting platforms 115 may additionally be included within the deposition chamber 107.

The deposition chamber 107 may also have pumping channels 121 for exhaust gases to exit the deposition chamber 107. A vacuum pump (not shown) may be connected to the pumping channels 121 of the deposition chamber 107 in order to help evacuate the exhaust gases. The vacuum pump, under control of the control unit 119, may also be utilized to reduce and control the pressure within the deposition chamber 107 to a desired pressure and may also be utilized to evacuate precursor materials from the deposition chamber 107 in preparation for the introduction of a purge gas.

Figure 2:
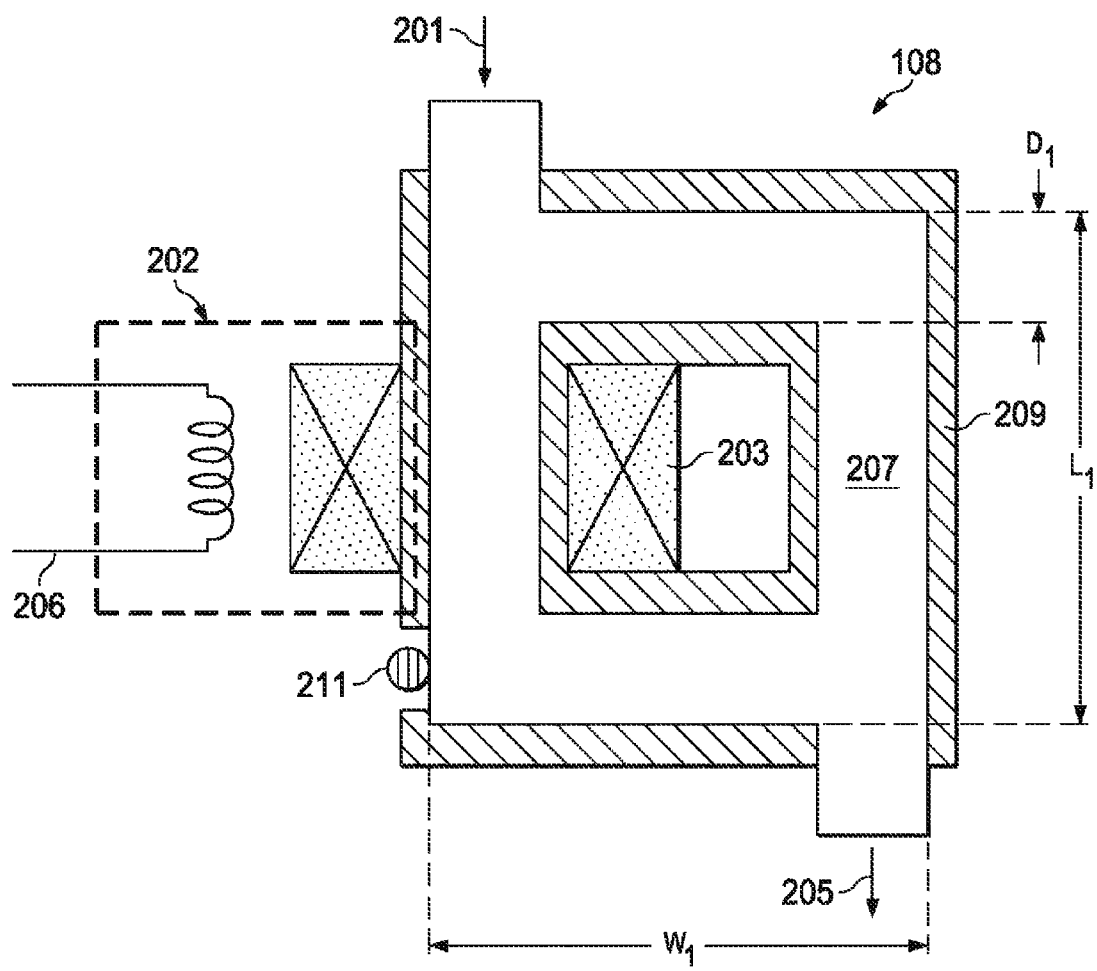
FIG. 2 illustrates a plasma generation unit in accordance with an embodiment.

FIG. 2 illustrates an embodiment of the plasma block 108 (or plasma generator) from FIG. 1 in greater detail. In an embodiment the plasma block 108 has an inlet port 201 that receives the first precursor material from the first precursor gas controller 111 and an outlet port 205 that is coupled to deliver a first precursor plasma (converted from the first precursor material) to the showerhead 113. The first precursor material enters the plasma block 108 and passes between a magnetic core 203 that surrounds a portion of the plasma block 108. The magnetic core 203 is utilized to induce the formation of the first precursor plasma from the first precursor material that enters the plasma block 108 before exiting out of an outlet port 205.

The magnetic core 203 may be situated around a portion of the flow path through the plasma block 108 from the inlet port 201 to the outlet port 205. In an embodiment the magnetic core 203 is one portion of a transformer 202 (illustrated in FIG. 2 with dashed line 202), with a primary coil 206 forming another portion of the transformer 202. In an embodiment the primary coil 206 may have a winding of between about 100 and about 1000 such as about 600.

To generate the desired first precursor plasma from the first precursor material within the plasma block 108, a short, high-voltage pulse of electricity controlled, e.g., by the control unit 119 (see FIG. 1) may be applied to the primary coil 206. The high-voltage pulse of electricity in the primary coil 206 is transformed to a pulse of energy into the magnetic core 203, which induces the formation of the first precursor plasma within the plasma block 108. In an embodiment the high-voltage pulse may be between about 10 KHz and about 2 MHz such as about 1 MHz for a duration of between about 0.01 ms and about 1 s, such as about 10 ms.

However, while igniting the first precursor material with a magnetic coil is described as an embodiment that may be used with the embodiments, the embodiments are not so limited. Rather, any suitable method or structures may be used to ignite the first precursor material to form the first precursor plasma. For example, in alternative embodiments a high voltage pulse may be applied to an electrode (not illustrated) coupled to the plasma block 108, or the first precursor material may be exposed to a ultraviolet radiation that may be used to ignite the first precursor material and form the first precursor plasma. Any suitable method of igniting the first precursor material and any other suitable plasma inducing device are fully intended to be included within the scope of the embodiments.

The plasma block 108 comprises a circular path between the inlet port 201 and the outlet port 205 in which the first precursor material may travel. In an embodiment the circular path may have a first length $L_1$ of between about 100 mm and about 500 mm, such as about 250 mm, and a first width $W_1$ of between about 100 mm and about 500 mm such as about 250 mm. Similarly, the interior of the circular path through the plasma block may have a first diameter $D_1$ of between about 20 mm and about 150 mm, such as about 70 mm. However, any other suitable structure or shape may alternatively be utilized.

The plasma block 108 also comprises an inner housing 207 and an insulator 209 surrounding the inner housing 207. The insulator 209 may be used to electrically and thermally isolate the inner housing 207 of the plasma block 108. In an embodiment the inner housing 207 encloses and encapsulates the circular path of the first precursor material and (after ignition) the first precursor plasma in order to guide the first precursor material and the first precursor plasma through the plasma block 108.

The inner housing 207 of the plasma block 108 is made from a material that is resistant to the deleterious effects of exposure to the first precursor plasma created by the plasma block 108. For example, the inner housing 207 of the plasma block 108 is a material such as beta-phase aluminum oxide. In a particular embodiment the inner housing 207 of the plasma block 108 may comprise a beta-phase aluminum oxide in which sodium ions are incorporated into the crystalline lattice of the aluminum oxide by occupying scarcely occupied planes between thin layers of dense alumina. For example, the beta-phase aluminum oxide may be beta-alumina ($11Al_2O_3$-$xNa_2O$), where x is between 1.0 and 1.6, such as being between 1.25 and 1.4, or beta-double prime alumina ($Na_2O \cdot 5Al_2O_3$), although any other suitable beta phase aluminum oxide may alternatively be utilized.

By utilizing a beta-phase aluminum oxide, the inner housing 207 of the plasma block 108 is stronger, more reliable, and more resistant to deterioration from exposure to the various plasmas that are generated within the plasma block 108. By having less deterioration, there is a reduced likelihood that plasma pollution caused by such deterioration will occur, leading to a cleaner, more efficient plasma generation process. This allows for a broader processing window, a more reliable process performance, and an improved yield from defects. Additionally, by being more resistant to deterioration, maintenance is not needed as often, leading to lower maintenance costs and less downtime for the deposition system 100.

The inner housing 207 of the plasma block 108 may be formed using any suitable method for forming and shaping beta-phase aluminum oxide into the desired shape for the plasma block 108. In an embodiment the inner housing 207 may be formed by casting the beta-phase aluminum oxide into the shape of the inner housing 207. However, other suitable forming and shaping techniques, such as milling or other physical removal processes, may alternatively be utilized.

The plasma block 108 may also comprise a sensor 211 that may be used to measure the conditions within the plasma block 108. In an embodiment the sensor 211 may be a current probe used to measure the current and power of the plasma as part of a feedback loop to the control unit 119 (see FIG. 1). In addition, or alternatively, the sensor 211 may also comprise an optical sensor or any other measurement devices that may be used to measure and control the plasma generation within the plasma block 108.

Returning to FIG. 1, the formation of the deposited layer 101 may be initiated by putting a first precursor into the first precursor delivery system 105. For example, in an embodiment in which the deposited layer 101 is a dielectric layer such as silicon nitride, the first precursor material may be a precursor such as ammonia ($NH_3$). Alternatively, any other suitable precursor material in any suitable phase (solid, liquid, or gas) to form a layer of silicon nitride, such as nitrogen ($N_2$), $NH_4OH$, $NO$, $N_2O$, $NO_2$, combinations thereof, or the like, may alternatively be utilized, and any other precursor that may be transformed into a plasma for use in the deposition of any other materials may also alternatively be utilized.

Additionally, the second precursor material may be placed into or formed by the second precursor delivery system 110. In the embodiment in which a layer of silicon nitride is desired for the deposited layer 101 and the first precursor material is ammonia, the second precursor material may be a silicon containing second precursor material. For example, in the embodiment in which ammonia is utilized as the first precursor material, trisillylamine (TSA) may be used as the second precursor material and may be placed into the second precursor delivery system 110. Alternatively, any other suitable precursor material, such as disillylamine or other sillyl-amines, or combinations of these, may be utilized as the second precursor material.

However, as one of ordinary skill in the art will recognize, the above described precursor materials used to form a layer of silicon nitride are not the only precursor materials that may be used. Rather, any materials or combination of materials may alternatively be utilized to form a layer of silicon nitride, and other precursors or combination of precursors may alternatively be utilized to form other conductive and dielectric layers on the substrate 103. All such precursor combinations are fully intended to be included within the scope of the embodiments.

Once the first precursor material and the second precursor material are ready in the first precursor delivery system 105 and the second precursor delivery system 110, respectively, the formation of the deposited layer 101 may be initiated by the control unit 119 sending an instruction to the first precursor gas controller 111 and the second precursor gas controller 112 to connect the first precursor delivery system 105 and the second precursor delivery system 110 to the deposition chamber 107. Once connected, the first precursor delivery system 105 can deliver the first precursor material (e.g., ammonia) to the showerhead 113 through the plasma block 108, with the plasma block 108 inducing the formation of the first precursor plasma as the first precursor material passes through the plasma block 108. The showerhead 113 can then disperse the first precursor plasma into the deposition chamber 107, wherein the first precursor plasma can be adsorbed and react to the exposed surface of the substrate 103.

In the embodiment in which the deposited layer 101 is silicon nitride formed with ammonia and TSA, the first precursor material may be flowed into the plasma block 108 at a flow rate of between about 1 sccm and about 2000 sccm, such as about 1000 sccm. Additionally, the deposition chamber 107 may be held at a pressure of between about 0.1 Torr and about 10 Torr, such as about 5 Torr, and a temperature of between about 100° C. and about 500° C., such as about 250° C. However, as one of ordinary skill in the art will recognize, these process conditions are only intended to be illustrative, as any suitable process conditions may be utilized while remaining within the scope of the embodiments.

Optionally, a noble gas such as argon may be added to the first precursor material before the first precursor material enters the plasma block 108. Such an introduction of a noble gas helps with the ignition of the first precursor material by lowering the voltage required to ignite the first precursor material into the first precursor plasma.

At the same time, the introduction of the second precursor material (e.g., TSA) to the deposition chamber 107 may be initiated by the control unit 119 sending an instruction to the second precursor gas controller 112 to connect the second precursor delivery system 110 (supplying the second precursor material) to the deposition chamber 107. Once connected, the second precursor delivery system 110 can deliver the second precursor material to the showerhead 113 at the same time, before, or after the first precursor plasma. The showerhead 113 can then disperse the second precursor material into the deposition chamber 107, wherein the second precursor material can react with the first precursor material to form the desired deposited layer 101 on the substrate 103.

In the embodiment discussed above to form a layer of silicon nitride with ammonia and TSA, the TSA may be introduced into the deposition chamber 107 at a flow rate of between about 10 sccm and about 2000 sccm, such as about 1000 sccm. However, as one of ordinary skill in the art will recognize, these process conditions are only intended to be illustrative, as any suitable process conditions may be utilized to introduce oxygen while remaining within the scope of the embodiments.

Figure 3:
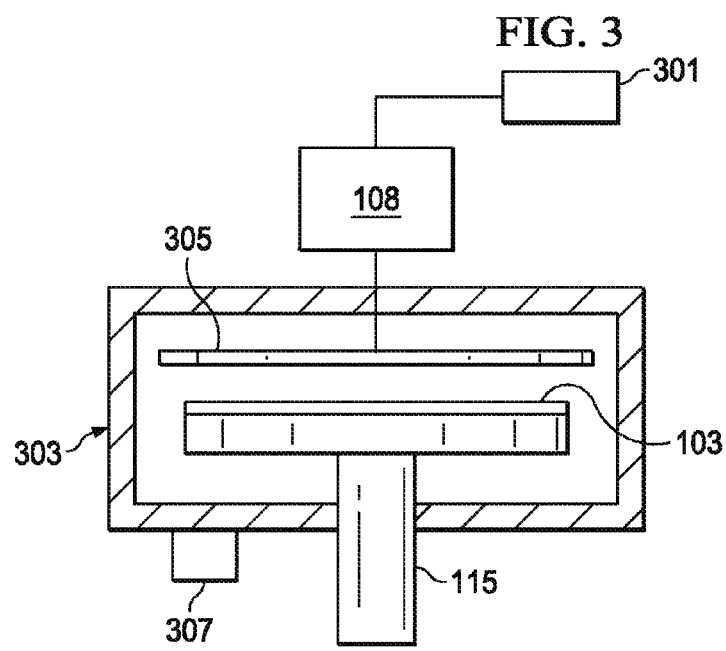
FIG. 3 illustrates a plasma generation unit in an etching process in accordance with an embodiment.

FIG. 3 illustrates an alternative embodiment which may utilize the plasma block 108 in a physical vapor deposition Aktiv preclean process. In this embodiment, rather than a deposition process using the deposition chamber 107, the pre-clean process that utilizes plasma is illustrated. In this embodiment a cleaning material such as hydrogen gas is loaded into a third delivery system 301, although any suitable cleaning material may alternatively be utilized. Optionally, a diluent gas such as helium may be mixed with the cleaning material. The third delivery system 301 may be similar to the first precursor delivery system 105 and the second precursor delivery system 110 (discussed above with respect to FIG. 1) but may alternatively be different.

The third delivery system 301 may deliver the cleaning material to the plasma block 108. The plasma block 108, made from beta-phase aluminum oxide, may be utilized to ignite the cleaning material (e.g., hydrogen gas or fluorine gas) into a cleaning plasma and dissociate the cleaning material into its respective ions. The use of beta-phase aluminum oxide helps to protect the plasma block 108 and reduce the maintenance of the plasma block 108.

Once the plasma block 108 has ignited the cleaning material into a cleaning plasma, the plasma block 108 may deliver the cleaning plasma into a cleaning chamber 303, where the substrate 103 rests on the mounting platform 115. The plasma block 108 may deliver the cleaning plasma to a second showerhead 305 within the cleaning chamber 303. In this embodiment the second showerhead 305 may be shaped to evenly distribute the cleaning plasma throughout the cleaning chamber 303 and to evenly distribute the cleaning plasma along a surface of the substrate 103. The second showerhead 305 may have a circular design with openings dispersed evenly around the second showerhead 305. Process conditions such as pressure within the cleaning chamber 303 may be controlled by a pump 307.

By utilizing the plasma block 108 to generate the plasma, such cleaning can produce an efficient removal of any residues, such as polymeric residues or metallix oxides (e.g., CuO), that may build up on the substrate 103 during other processing steps. However, the use of a remote plasma system provides the plasma without exposing the substrate 103 directly to the plasma, helping to protect such materials as porous SiCOH.

In accordance with an embodiment, a remote plasma system comprising an inlet port is provided. An inner housing is coupled to the inlet port to generate a plasma, the inner housing comprising beta-phase aluminum oxide, and an outlet port is coupled to the inner housing.

In accordance with another embodiment, a remote plasma system comprising a semiconductor processing chamber is provided. A showerhead is within the semiconductor processing chamber, the showerhead comprising a plasma inlet to receive a plasma precursor, and a plasma generator is coupled to the plasma inlet, the plasma generator comprising a plasma inducing device and a inner housing, the inner housing comprising sodium, aluminum, and oxygen atoms.

In accordance with yet another embodiment, a method of manufacturing semiconductor devices comprising introducing a first precursor material into a plasma generation unit, the plasma generation unit comprising beta-phase aluminum oxide is provided. A plasma is induced from the first precursor material, and the plasma is introduced to a semiconductor manufacturing chamber.

Although the present embodiments and their advantages have been described in detail, it should be understood that various changes, substitutions, and alterations can be made herein without departing from the spirit and scope of the disclosure as defined by the appended claims. For example, the materials and processes described herein are intended for illustrative purposes only, as the precursor materials may be modified. Additionally, the embodiments may be used in a variety of plasma processes, such as deposition, etching, cleaning, and other plasma operations.

Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of manufacturing semiconductor devices, the method comprising:
    introducing a first precursor material into a remote plasma generation unit, the remote plasma generation unit comprising beta-phase aluminum oxide;
    inducing a plasma from the first precursor material in the remote plasma generation unit; and
    after the inducing the plasma, introducing the plasma to a semiconductor manufacturing chamber.

2. The method of claim 1, wherein the introducing the plasma to the semiconductor manufacturing chamber further comprises introducing the plasma to a showerhead within the semiconductor manufacturing chamber.

3. The method of claim 2, further comprising introducing a second precursor material to the showerhead at a same time as the plasma.

4. The method of claim 3, further comprising depositing a layer of material onto a substrate using the plasma and the second precursor material.

5. The method of claim 1, further comprising etching a substrate utilizing the plasma.

6. The method of claim 1, further comprising depositing silicon nitride onto a substrate utilizing the plasma.

7. A method of manufacturing a semiconductor device, the method comprising:
   introducing a first material into an inlet port of a remote plasma generation unit, wherein the inlet port is connected to a housing, the housing comprising beta-phase aluminum oxide;
   applying a voltage pulse to induce the generation of a first plasma from the first material within the housing;
   delivering the first plasma to a showerhead through an outlet port connected to the housing of the remote plasma generation unit; and
   introducing the first plasma to a semiconductor process chamber through the showerhead.

8. The method of claim 7, wherein the voltage pulse is applied to a first part of a transformer.

9. The method of claim 7, wherein the voltage pulse is applied to an electrode.

10. The method of claim 7, further comprising exposing a substrate to the first plasma within the semiconductor process chamber, wherein the exposing the substrate is part of a chemical vapor deposition process.

11. The method of claim 7, further comprising exposing a substrate to the first plasma within the semiconductor process chamber, wherein the exposing the substrate is part of a plasma cleaning process.

12. The method of claim 7, further comprising exposing a substrate to the first plasma within the semiconductor process chamber, wherein the exposing the substrate is part of a plasma etching process.

13. The method of claim 7, further comprising exposing a substrate to the first plasma within the semiconductor process chamber, wherein the exposing the substrate is part of a plasma treatment process.

14. A method of manufacturing a plasma generating unit, the method comprising:
   shaping a first material into a plasma generation housing, wherein the first material comprises beta-phase aluminum oxide represented by the formula $11Al_2O_3\text{-}xNa_2O$, and wherein x is between 1.25 and 1.4; and
   placing an ignition unit adjacent to the plasma generation housing.

15. The method of claim 14, wherein the ignition unit comprises a transformer.

16. The method of claim 14, wherein the ignition unit comprises an electrode.

17. The method of claim 14, wherein the ignition unit comprises ultraviolet radiation.

18. The method of claim 14, wherein the shaping the first material comprises casting the first material into the shape of the housing.

19. The method of claim 14, wherein the shaping the first material comprises a physical removal process.

20. The method of claim 11, wherein the first plasma comprises hydrogen plasma.

* * * * *